United States Patent [19]

Fiegl et al.

[11] 4,396,824

[45] Aug. 2, 1983

[54] CONDUIT FOR HIGH TEMPERATURE TRANSFER OF MOLTEN SEMICONDUCTOR CRYSTALLINE MATERIAL

[75] Inventors: George Fiegl, Palo Alto; Walter Torbet, Newark, both of Calif.

[73] Assignee: Siltec Corporation, Menlo Park, Calif.

[21] Appl. No.: 82,640

[22] Filed: Oct. 9, 1979

[51] Int. Cl.³ .................... H05B 3/44; F16L 53/00; F16L 9/14

[52] U.S. Cl. .................... 219/301; 137/341; 138/140; 138/149; 138/153; 138/177; 156/617 SP; 156/623 R; 164/337; 219/300; 219/421; 219/535; 222/146 HE; 222/593; 428/36; 428/408

[58] Field of Search .............. 219/300, 301, 421, 535; 138/140, 141, 149, 153, 177; 428/36, 408; 156/617 SP, 623, 604, 608; 137/341; 222/146 R, 146 H, 146 HE, 590-593; 13/33; 422/248, 249; 164/337

[56] References Cited

U.S. PATENT DOCUMENTS

| | | | |
|---|---|---|---|
| 1,572,300 | 2/1926 | Max | 137/341 |
| 2,375,563 | 5/1945 | Kirk | 219/301 X |
| 2,459,869 | 1/1949 | Christensen et al. | 156/623 |
| 2,606,574 | 8/1952 | Lefebvre | 138/140 |
| 2,660,769 | 12/1953 | Bennett | 222/146 HE |
| 3,093,456 | 6/1963 | Runyan et al. | 156/608 |
| 3,495,630 | 2/1970 | Hansen et al. | 138/149 |
| 3,499,736 | 3/1970 | Zwaneburg | 156/617 SP |
| 3,815,623 | 6/1974 | Farmer | 137/341 |
| 3,980,105 | 9/1976 | Myskowski | 428/36 X |
| 4,036,595 | 7/1977 | Lorenzini et al. | 156/617 SP |
| 4,192,988 | 3/1980 | Pederson | 219/301 X |
| 4,282,184 | 8/1981 | Fiegl et al. | 422/249 X |

FOREIGN PATENT DOCUMENTS

| | | | |
|---|---|---|---|
| 239977 | 5/1965 | Austria | 164/337 |
| 1157366 | 12/1957 | France | 164/337 |
| 1477257 | 3/1967 | France | 219/301 |
| 1498354 | 9/1967 | France | 222/591 |

*Primary Examiner*—A. Bartis
*Attorney, Agent, or Firm*—C. Michael Zimmerman

[57] ABSTRACT

A conduit for high temperature transfer of molten semiconductor crystalline material consists of a composite structure incorporating a quartz transfer tube as the innermost member, with an outer thermally insulating layer designed to serve the dual purposes of minimizing heat losses from the quartz tube and maintaining mechanical strength and rigidity of the conduit at the elevated temperatures encountered. The composite structure ensures that the molten semiconductor material only comes in contact with a material (quartz) with which it is compatible, while the outer layer structure reinforces the quartz tube, which becomes somewhat soft at molten semiconductor temperatures. To further aid in preventing cooling of the molten semiconductor, a distributed, electric resistance heater is in contact with the surface of the quartz tube over most of its length. The quartz tube has short end portions which extend through the surface of the semiconductor melt and which are lef bare of the thermal insulation. The heater is designed to provide an increased heat input per unit area in the region adjacent these end portions.

6 Claims, 3 Drawing Figures

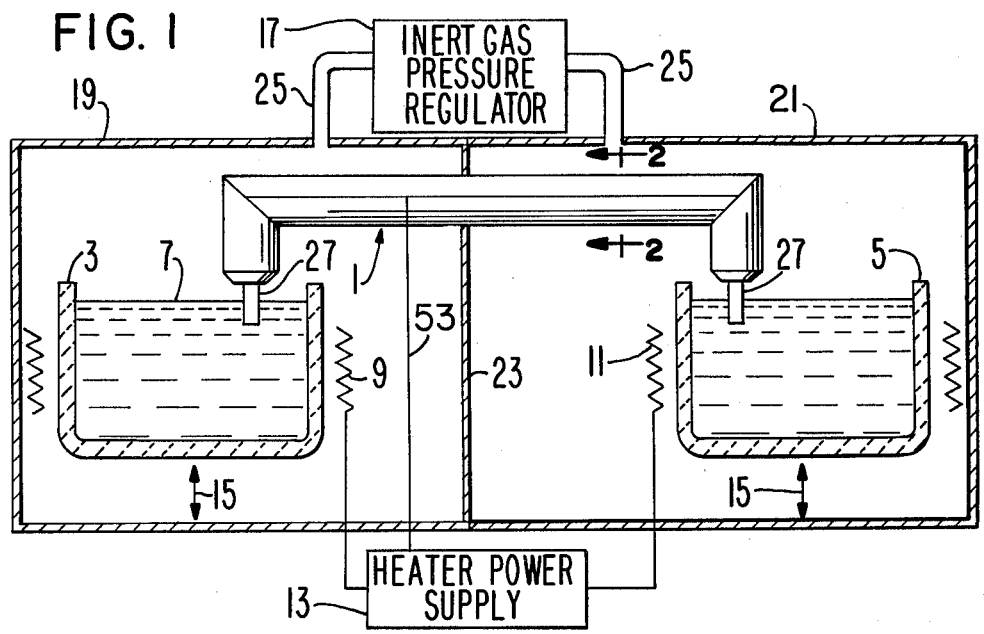
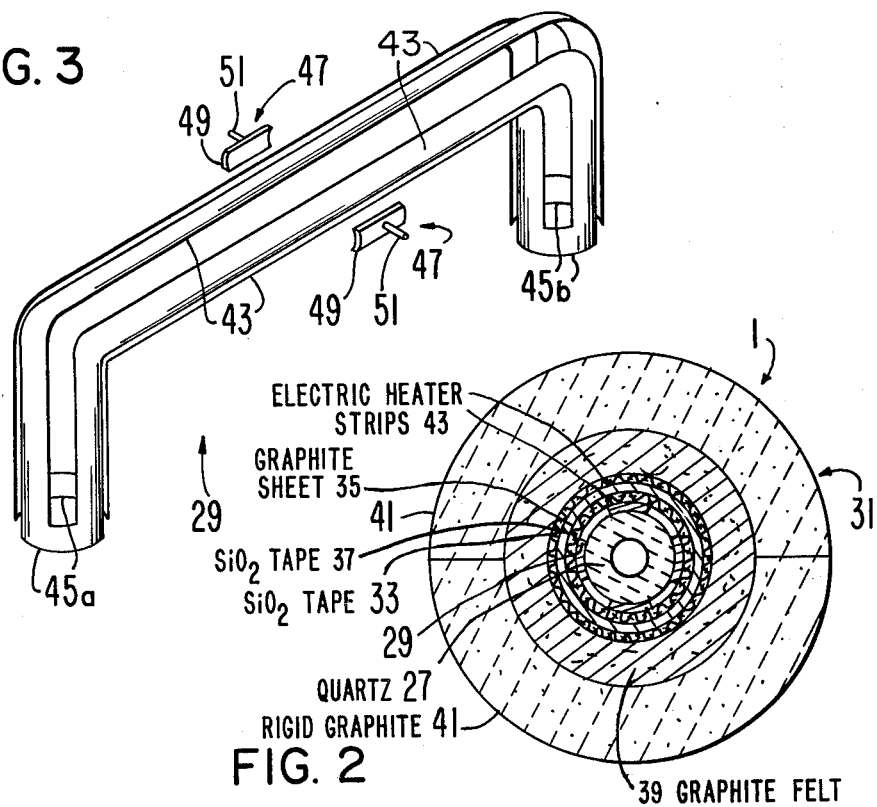

CONDUIT FOR HIGH TEMPERATURE TRANSFER OF MOLTEN SEMICONDUCTOR CRYSTALLINE MATERIAL

The invention described herein was made in the performance of work under NASA Contract No. NAS 7-100, JPL Subcontract No. 954886, and is subject to the provisions of Section 305 of the National Aeronautics Space Act of 1958 (72 STAT 435; 42 U.S.C. 2457).

BACKGROUND OF THE INVENTION

In the growing of semiconductor crystals from a "melt" of molten semiconductor it has sometimes become necessary to transfer the semiconductor at a high temperature on the order of 1425° C. from one vessel to another without encountering solidification or contamination by contact with impurities.

For example, in the production of polycrystalline silicon it may be necessary to melt various sized pieces of the silicon raw material in a central crucible to produce a reservoir or "melt", over which a slag consisting principally of silicon oxide forms. The silicon is then transferred from a point within the central melt by means of various conduits or transfer tubes to remote locations for utilization in casting or crystal-growing operations. Several advantages accrue from this arrangement. By extracting the molten silicon from a point well within the melt and away from the slag on the surface, a considerable elimination of silicon oxides and other impurities is achieved. Further, the removal to a separate location of the growing or casting operations leaves the central meltdown crucible available for the addition of fresh supplies of silicon raw material.

Similarly, in the growing of high quality monocrystalline boules by the Czochralski process it has recently become possible to significantly reduce the cost of the boules and, consequently, the cost of the wafers sliced therefrom, by resort to a continuous production process in which silicon in polycrystalline form is melted in a meltdown crucible at the same time that the monocrystalline boules are being drawn in an adjacent drawing crucible connected to the meltdown crucible by a conduit. Such a system is described and claimed in our commonly assigned copending patent application Ser. No. 83,169 filed concurrently herewith and granted as U.S. Pat. No. 4,282,184 on Aug. 4, 1981.

Unfortunately, the task of transferring molten high purity silicon from one crucible to another without any significant loss in quality enroute is attended with a number of difficult problems.

Since the silicon must be maintained in its initial high purity state, it may not be permitted to come in contact with a wide range of materials while it is molten and at a high temperature because of its ready ability to form alloys and compounds with these materials. In practice, the only satisfactory material from which to fabricate both the crucibles and the transfer tube is quartz which is, chemically, silicon dioxide ($SiO_2$).

At the temperature of molten silicon, even quartz is fairly rapidly reduced and eroded away. Fortunately the rate of erosion is tolerable although expensive. More importantly, the byproducts, silicon and oxygen, are fairly compatible with the melt being transferred. Nevertheless, since erosion is significant, replacement of crucibles and transfer tubes must be made as easy and simple as possible.

Another significant fault of quartz when used as a means of storing or transporting molten semiconductor materials is its relative mechanical weakness at the temperatures encountered. The softening temperature of pure quartz is approximately 1600° C. However, the quartz actually available at a reasonable cost contains some impurities which cause significant softening and weakening even at the approximately 1425° C. temperatures encountered in use with molten silicon.

Other problems also beset the designer of a conduit for transferring molten silicon. In practice, the silicon can rarely be raised far above its fusion temperature without significant increases in erosion and softening of the quartz. In fact, the melt must be maintained substantially at the fusion temperature in a crucible from which a boule is being grown by the Czochralski process. Consequently, there is always a significant danger of unwanted solidification occurring in the transfer tube and causing an abrupt and expensive termination of operations.

Thorough insulation of the transfer tube has not proven by itself to be an adequate solution to the problem of solidification. Although heat loss can be significantly reduced by this means, the silicon is operating at a temperature so close to its fusion point that even relatively minor heat losses can precipitate a disastrous solidification and blockage of a transfer tube. Consequently, it has become necessary to incorporate a heater extending in some fashion along the transfer tube to supply heat lost in transit of the molten silicon from the meltdown crucible to a remote location.

Even the use of such a heater overlaying the transfer tube has not proven entirely satisfactory in eliminating unwanted solidification within the tube. The problem of solidification continues to exist even though the power input to the transfer tube is adequate, in combination with the thermal insulation provided, to hold the temperature above the fusion point of the molten silicon. Careful investigation of the temperature along the length of the quartz transfer tube, however, has revealed the cause of these continuing solidifications.

The type of conduit under consideration is one in which the quartz transfer tube, the innermost member which actually carries the molten silicon, extends downwardly through the surface slag layers of a meltdown crucible, and may also extend downwardly into a utilization crucible at its other end, remote from the meltdown crucible.

In order that the outer thermal insulation layers of the conduit not contact the molten silicon, it is necessary to terminate the thermal insulation layer surrounding the transfer tube at a point short of contact with the molten semiconductor. Given reasonable manufacturing tolerances and the necessity to accommodate some change in melt level, this has meant in practice that a certain length of the quartz tube between the end of the thermal insulation layer and the surface of a melt had to be left exposed. By thermocouple measurement of the temperature profile along the transfer tube, the heat losses from these exposed portions were shown to be unexpectedly large and to constitute a significant problem. Consequently, even after the incorporation of heaters extending fully along the length of the insulated portion of the transfer tube there have been occasions of recurrence of the solidification problem.

SUMMARY OF THE INVENTION

The principal object of the present invention is to provide a conduit through which molten semiconductor material can be transported reliably without solidification in transit.

A second object of the present invention is to provide such a conduit in which the molten semiconductor contacts only materials which are compatible with it essentially retaining its original composition.

A third object of the present invention is to provide such a conduit in which only an inner transfer tube, made of quartz, contacts the molten semiconductor.

A fourth object of the present invention is to provide such a conduit in which the quartz transfer tube is surrounded by an outer layer of highly thermally insulative material terminating short of the ends of the quartz transfer tube, which can then be dipped into a melt of molten semiconductor without contamination thereof by the material of the insulator layer.

A fifth object of the present invention is to provide such a conduit incorporating between the quartz transfer tube and the thermally insulative outer layer a surface-extensive heater for preventing solidification of the molten semiconductor in transit.

A sixth object of the present invention is to provide that the heater of the immediately preceding object has an increased heat output in regions adjacent the termination of the outer insulative layer, whereby extra heat is provided at these points to prevent solidification where the quartz transfer tube emerges from the thermally insulative outer layer.

A seventh object of the present invention is to provide such a conduit in which the outer insulative layer also serves as a mechanically reinforcing member to preserve the stiffness and configuration of the quartz tube despite softening of the quartz at high temperatures.

To the above ends the conduit according to the present invention incorporates a transfer tube of quartz of a length and shape designed to extend between a source of molten semiconductor material and a location remote from said source where the semiconductor material is to be utilized. A surface-extensive heater is in contact with the quartz tube throughout most of its length. Overlaying and substantially coterminous with the heater is an outer insulative jacket having a composite structure in which an inner portion immediately overlaying the quartz tube and heater comprises thermally insulative materials of relatively low density, with an outer layer made of solid graphite or other relatively rigid refractory material which provides the necessary mechanical strength at high temperatures. The surface-extensive heater may preferably be made of carbon or silicon carbide, and heated by passage of an electric current from a power supply. By varying the distribution and cross-sectional area of the conductors of the heater, the heat input at various axial positions along the length of the quartz tube may be varied to suit the requirements and to compensate for non-uniform losses.

The above and other features, objects, and advantages of the present invention, together with the best mode contemplated by the inventors for carrying out their invention will become more apparent from reading the following detailed description of a preferred embodiment and perusing the drawings in which:

BRIEF DESCRIPTION OF THE DRAWINGS

FIG. 1 is a side view partially in elevation and partially in section and including certain elements shown schematically, illustrating the use of a molten semiconductor conduit according to the present invention;

FIG. 2 is a cross-sectional view taken along lines 2—2 in FIG. 1 showing details of the construction of the conduit of FIG. 1;

FIG. 3 is a perspective view illustrating the configuration of a surface-extensive heater according to the present invention.

DETAILED DESCRIPTION OF A PREFERRED EMBODIMENT

In FIG. 1 a conduit 1 for high temperature transfer of molten semiconductor material between a meltdown crucible 3 and a utilization crucible 5 is shown. Both crucibles 3 and 5 are preferably made of quartz, or any other material which is suitable for non-contaminating contact with the semiconductor material in question. For use with silicon, the most satisfactory material yet found seems to be quartz.

Within meltdown crucible 3, a melt 7 of semiconductor crystalline material which may be silicon is contained. Meltdown crucible 3 may also be provided with suitable means for addition of raw silicon in chunk or powder form to be melted down, thus replenishing the supply of melt 7 as it is withdrawn. Molten semiconductor from melt 7 is withdrawn through conduit 1 for utilization in a variety of casting or crystal-growing operations which take place at locations remote from meltdown crucible 3.

Thus, utilization crucible 5 might in practice be the site for crystal-drawing operations for forming either monocrystalline or polycrystalline boules of semiconductor. Alternatively, utilization crucible 5 might symbolize a mold within which molten semiconductor material is allowed to solidify. Moreover, although only a single conduit 1 has been illustrated in FIG. 1, it is to be understood that in a large system for centrally melting down crystalline semiconductor material and transferring it to remote locations for utilization, a number of such conduits 1 and utilization crucibles 5, or the like, would be provided.

Typically, both crucibles 3 and 5 would be provided with crucible heaters 9 and 11 of substantially cylindrical form extending about the periphery of crucibles 3 and 5 and supplied with electric power from a heater power supply 13.

Also, although not shown, means might be provided for raising and lowering crucible 3 and 5 as indicated generally by arrows 15 for the purpose of controlling melt levels as needed for crystal growing operations, or for the purpose of transferring molten semiconductor from crucible 3 to crucible 5 by means of the siphon effect. In using the siphon effect as a means of transferring molten semiconductor from crucible 3 to crucible 5, the height of the crucibles would be typically arranged so that the surface or melt level of the molten semiconductor is the same in each crucible. Under these conditions with no ambient pressure differential between the two crucibles, conduit 1 acting as a siphon tube would automatically maintain a constant melt level in crucible 5 identical to the melt level in crucible 3.

Alternatively, an inert gas pressure regulator 17 could be used to establish a pressure differential of constant magnitude between the regions surrounding the two crucibles. Under this condition, a constant difference of melt level would exist between the two crucibles.

In FIG. 1, the isolation of the meltdown crucible 3 and utilization crucible 5 has been defined by a first enclosure 19 surrounding crucible 3 and a second enclosure 21 surrounding utilization crucible 5. Although a common wall 23 has been indicated, it is to be understood that enclosures 19 and 21 might, in practice, be separated by some considerable distance depending on the application. Pressure regulator 17 would typically be connected to a source of inert gas (not shown) such as argon. A pair of gas conduits 25 connect regulator 17 with enclosures 19 and 21.

Prior to heating the semiconductor to melt it, enclosures 19 and 21 would typically be purged of air and filled with inert gas, since semiconductor materials, especially silicon, at high temperatures would be contaminated by contact with the oxygen and nitrogen in air. Thereafter, regulator 17 may be used to maintain a steady, constant-pressure supply of inert gas within enclosures 19 and 21.

In the case that conduit 1 operates as a siphon tube, regulator 17 could conveniently interconnect enclosures 19 and 21 by means of gas conduits 25 such that there is no ambient pressure difference between the two enclosures. Under these conditions conduit 1 acting as a siphon tube would maintain the same level of melt in crucibles 3 and 5.

Alternatively, if it were desired to operate the crucibles with different melt levels as illustrated in FIG. 1, regulator 17 could maintain a constant offset or pressure differential between enclosures 19 and 21, such that the higher pressure maintained in enclosure 21 was exactly the right amount to maintain the head difference illustrated between melts in crucibles 3 and 5. In this latter case conduit 1 would continue to operate as a siphon tube in the sense that depletion of the melt in crucible 5 as a result of crystal drawing, for example, would be replenished by molten semiconductor flowing through conduit 1 to reestablish the initial offset in melt levels between crucibles 3 and 5.

As a further alternative, pressure regulator 17 could be used to transfer molten semiconductor from crucible 3 to crucible 5 without relying upon the siphon effect. In this case the conduit 1 need not project into the melt in crucible 5, but could terminate a short distance above the melt, with transfer between the two crucibles thus taking place solely under the influence of the ambient pressure difference between enclosures 19 and 21 as established by inert gas pressure regulator 17. Further alternatives exist for transferring molten semiconductor from crucible 3 to crucible 5. Any known means of pumping may be utilized.

Conduit 1 as shown in FIG. 1 and especially in the cross-sectional view of FIG. 2 is a composite structure consisting essentially of three major parts: an inner transfer tube 27 which may be made of quartz and might have, for example, an outside diameter of approximately 25 mm, and an inside diameter of approximately 7 mm; a surface-extensive heater 29, the details of one embodiment of which are best shown in FIG. 3, and a multi-layered, thermally insulating and reinforcing structure 31.

Insulating and reinforcing structure 31 comprises a plurality of layers of various insulator materials. Overlaying quartz transfer tube 27 and heater 29 is a first silica (SiO$_2$) tape layer 33 which may be helically wound around transfer tube 27 and heater 29. Layer 33 may be used to maintain heater 29 firmly in contact with quartz transfer tube 27. Although for initial mounting purposes heater 29 may be secured to the surface of tube 27 by a suitable adhesive, at the elevated temperatures encountered in operation the adhesive is driven off such that layer 33 provides the necessary firm contact between heater 29 and tube 27.

Over layer 33 is positioned a graphite sheet layer 35 which may be made of the same material as heater 29. A second layer of silica tape 37 is wound over graphite sheet layer 35. A heavy layer 39 of a porous insulation such as graphite felt (i.e. a felt material made of graphite fibers) overlays silica tape layer 37. Porous insulation layer 39 may be as much as one-half inch or more thick and thus provide a considerable degree of thermal insulation which is enhanced by the relatively low density of the felt material.

Since fibers from the graphite felt have a considerable ability to work through other layers and successfully penetrate them in time, the inclusion of layer 35 of graphite sheeting as a barrier to these fibers is necessary to prevent their penetration through the silica tape such that they could very easily short-circuit portions of heater 29.

The thermally insulative structure is completed by a relatively dense outer shell 41 made of a relatively rigid refractory material such as solid graphite, encompassing the remainder of the structure. Outer shell 41 provides some additional thermal insulation and considerable structural rigidity and strength at the elevated temperatures encountered in use. As shown in FIGS. 1 and 2, the portion of outer graphite shell 41 which extends horizontally between enclosures 19 and 21 is longitudinally split into two identical semi-cylindrical shells. By means of such splitting, the assembling of shell 41 over the central section of the conduit 1 is facilitated. Moreover, the insertion of heater leads is facilitated.

Turning now to FIG. 3, heater 29 is shown in great detail in a perspective view which helps to illuminate the way it is adapted to solve the problems which occasioned the present invention. As can be seen in FIG. 3, heater 29 is comprised over the bulk of its length of a series of four resistive strips 43 which extend longitudinally of quartz transfer tube 27. Resistive strips 43 may be made of thin flexible graphite sheeting as is the remainder of heater 29, and may be approximately ⅜th-inch wide with approximately ⅜th-inch spacing between adjacent pairs of strips 43 when they are in position equi-spaced about the outer diameter of quartz transfer tube 27.

At the left end in the drawing of FIG. 3, a first pair of resistive interconnecting links 45a are shown interconnecting alternate pairs of resistive strips 43 at their ends. Similarly, at the right end of heater 29 in FIG. 3 a second pair of resistive interconnecting links 45b are shown interconnecting the ends of alternate pairs of resistive strips 43. However, it is to be noted that the orientation of links 45b is offset 90° from that of 45a links such that links 45a–b interconnect the four resistive strips 43 in a single series circuit loop configuration.

A pair of electrodes 47 may be made of molybdenum or other high temperature refractory metal, and each includes a contactor shoe 49 shaped to fit the curved outer surface of resistive strips 43. Each of contactor shoes 49 has connected thereto a heater lead 51 which may be substantially round as shown or flat, and bladelike. In either case, leads 51 can conveniently be brought out through the splits in outer shell 41 for connection to heater power supply 13 in FIG. 1 by means of supply leads represented by line 53 in FIG. 1.

In practice, heater 29 may be fabricated from a single sheet of graphite and by suitable folding and bending, shaped to fit quartz transfer tube 27, leaving only a single joint in the structure of heater 29. Heater 29 may then be adhered to tube 27 by means of a temporary bond formed by an adhesive such as a methacrylate cement. With heater 29 thus held in place on tube 27, electrodes 47 are placed over alternate pairs of resistive strips 43 and are aligned such that a diameter of tube 27 would pass axially through them along leads 51. Then silica tape layer 33 is wound over heater 29 and electrodes 47, thus holding them in place.

It is to be noted that so long as electrodes 47 are aligned directly opposite each other, their axial position along the strips 43 to which they are connected does not affect the electrical impedance presented by heater 29 to power supply 13. This is true because placing the electrodes 47 as described anywhere along the length of strips 43 divides the series loop formed by strips 43 and resistive links 45a–b into two parallel current paths, each having equal electrical resistance.

Further to be noted is that when heater 29 is properly dimensioned, resistive links 45a–b will occur closely adjacent to the end regions of thermally insulative structure 31 where quartz transfer tube 27 emerges from insulative structure 31 and is bare for a short distance before entering the molten semiconductor in crucibles 3 or 5. Because of the configuration of heater 29, the effect of such placement of resistive links 45a–b is to increase the thermal input, expressed in watts per centimeter, in these end regions where heat losses are the worst. The result is the provision of enough additional heat in the end regions to avoid disastrous solidification of the molten semiconductor in these regions, even at very low flow rates. Moreover, in cases where even the additional heat provided by links 45a–b is not adequate to prevent solidification, the cross-sectional area and especially the width of links 45a–b may be narrowed to increase their electrical resistance and energy dissipation. Moreover, the cross-sectional width of the end portions of strips 43 which attach to links 45a–b may also be narrowed to further increase the heating effect at the end regions.

Although the invention has been described with some particularity in reference to a preferred embodiment which comprises the best mode contemplated by the inventors for carrying out their invention, it will be obvious to those skilled in the art that many modifications could be made and many apparently different embodiments thus derived which do not exceed the scope of the invention. Therefore, the scope of the invention is to be interpreted only from the following claims.

We claim:

1. A conduit for conducting a fluid stream of a molten material at a high temperature comprising:
   a. a transfer tube through which said stream is to be conducted, which tube is made of a material which is substantially non-contaminating to said molten material;
   b. a reinforcing structure more structurally rigid than said transfer tube encompassing the exterior of said tube and extending substantially the full length thereof but terminating short of the ends of said transfer tube to leave the exposed end portions of said transfer tube for immersion into a body of said molten material without requiring contact between said reinforcing structure and said molten material;
   c. a heater extending over the surface of said transfer tube and substantially surrounding said transfer tube interiorly of said reinforcing structure, said heater being substantially coterminous with said reinforcing structure at said ends and arranged to provide to said tube a greater heat input per unit length in a region of said tube proximate said ends than at other regions thereof remote from said ends; and
   d. a layer of thermal insulating material interposed between said transfer tube and said reinforcing structure to transmit the structural rigidity of said insulating structure to said tube, said heater being disposed between said insulating material and said transfer tube.

2. The conduit of claim 1 wherein said molten material is silicon, said material of said transfer tube is quartz, and said reinforcing structure is graphite.

3. The conduit of claim 1 wherein said thermal insulating material is graphite felt.

4. A conduit for conducting a fluid stream of a molten material at a high temperature comprising:
   a. a transfer tube through which said stream is to be conducted, which tube is made of a material which is substantially non-contaminating to said molten material;
   b. a reinforcing structure more structurally rigid than said transfer tube encompassing the exterior of said tube and extending substantially the full length thereof but terminating short of the ends of said transfer tube to leave the exposed end portion of said transfer tube for immersion into a body of said molten material without requiring contact between said reinforcing structure and said molten material;
   c. a heater extending over the surface of said transfer tube and substantially surrounding said transfer tube interiorly of said reinforcing structure, said heater being substantially coterminous with said reinforcing structure at said ends and arranged to provide to said tube a greater heat input per unit length in a region of said tube proximate said ends than at other regions thereof remote from said ends; and
   d. said heater is an electrically resistive surface heater in substantial contact with the surface of said transfer tube, comprising three longitudinally extending circumferentially spaced resistive strips extending along the length of said tranfer tube, a first circumferentially extending resistive link electrically interconnecting a pair of said strips at one end thereof, and a second circumferentially extending resistive link at the other end of said strips electrically interconnecting one of said pair of strips with a third strip and forming said series circuit loop with said strips and said first link.

5. A conduit for conducting a fluid stream of a molten material at a high temperature comprising:
   a. a transfer tube through which said stream is to be conducted, which tube is made of a material which is substantially non-contaminating to said molten material;
   b. a reinforcing structure more structurally rigid than said transfer tube encompassing the exterior of said tube and extending substantially the full length thereof but terminating short of the ends of said transfer tube to leave the exposed end portions of said transfer tube for immersion into a body of said molten material without requiring contact between said reinforcing structure and said molten material;

c. a heater extending over the surface of said transfer tube and substantially surrounding said transfer tube interiorly of said reinforcing structure, said heater being substantially coterminous with said reinforcing structure at said ends and arranged to provide to said tube a greater heat input per unit length in a region of said tube proximate said ends than at other regions thereof remote from said ends; and d. wherein said heater comprises four resistive strips and four resistive links, said strips being oriented to extend axially along said transfer tube, said resistive links being oriented to circumferentially extend between, and electrically interconnect the ends, of said strips so as to form a single series circuit loop including said strips and said links.

6. The conduit of claim 5 wherein said heater is formed from flexible graphite sheet.

* * * * *